United States Patent
Clee et al.

(10) Patent No.: US 6,590,433 B2
(45) Date of Patent: Jul. 8, 2003

(54) REDUCED POWER CONSUMPTION BI-DIRECTIONAL BUFFER

(75) Inventors: James T. Clee, Orefield, PA (US);
Bernard L. Morris, Emmaus, PA (US);
James E. Guziak, Laurys Station, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/733,445

(22) Filed: Dec. 8, 2000

(65) Prior Publication Data

US 2002/0070769 A1 Jun. 13, 2002

(51) Int. Cl.$^7$ ................................................ H03B 1/00
(52) U.S. Cl. ........................ 327/109; 327/404; 327/562; 326/83; 330/257; 330/288
(58) Field of Search ..................... 327/108–112, 560, 327/561–563, 403–405, 333; 326/26–28, 30, 63, 82–84, 86–91, 57, 58; 365/189.05; 307/412; 330/252, 253, 257, 277, 288

(56) References Cited

U.S. PATENT DOCUMENTS

| | | | |
|---|---|---|---|
| 4,594,577 A | * 6/1986 | Mao | 341/135 |
| 4,725,982 A | 2/1988 | Hara et al. | 326/58 |
| 5,119,365 A | * 6/1992 | Warner et al. | 370/282 |
| 5,436,577 A | 7/1995 | Lee | 326/58 |
| 5,576,656 A | * 11/1996 | McClure | 327/538 |
| 5,726,587 A | 3/1998 | Ratner | 326/56 |
| 5,808,480 A | 9/1998 | Morris | 326/81 |
| 5,926,056 A | 7/1999 | Morris et al. | 327/333 |
| 5,966,110 A | * 10/1999 | Van Zalinge | 345/82 |
| 6,029,248 A | 2/2000 | Clee et al. | 713/320 |
| 6,034,551 A | * 3/2000 | Bridgewater, Jr. | 326/82 |
| 6,064,229 A | 5/2000 | Morris | 326/81 |

* cited by examiner

*Primary Examiner*—Minh Nguyen
(74) *Attorney, Agent, or Firm*—Duane Morris LLP

(57) ABSTRACT

A bi-directional buffer includes the capability to turn the current mirror off when the bi-directional buffer is in the receive mode and quickly turn the current mirror on when the bi-directional buffer goes into the transmit mode. This is accomplished in part by a pair of switches included in the current mirror, which are controlled by enable signals. The switches are configured such that the output transistor of the current mirror is turned on when the bi-directional buffer is in the transmit mode, and turned off when the bi-directional buffer is in the receive mode. Further, a pull up circuit may be added to the current mirror to more quickly bring the gate of the output transistor of the current mirror to its conduction threshold voltage.

12 Claims, 5 Drawing Sheets

REDUCED POWER CONSUMPTION BI-DIRECTIONAL BUFFER

FIELD OF THE INVENTION

The present invention relates to electronic circuits and specifically to bi-directional buffers.

BACKGROUND

A typical bi-directional buffer facilitates data transfer between devices. For example, a bi-directional buffer may be coupled between a network bus and a computer. FIG. 1 is a simplified block diagram of a typical bi-directional buffer, generally designated 1, coupled between an external device and a computer. External device 3 may be any external device such as a network coupled to bi-directional buffer 1 by a cable or a backplane. Computer 5 may be any computer, such as a personal computer, a server, or several computers or servers, coupled to bi-directional buffer 1 by a cable or backplane. Bi-directional buffer 1, receives data from an external device 3 during a receive mode. This data is transferred to computer 5. Bi-directional buffer 1 transmits data to external device 3 from computer 5 during a transmit mode. Enabling signals 6 determine whether bi-directional buffer 1 is in the transmit mode or the receive mode. Input stage 2 typically receives data from an external device 3 during the receive mode and output stage 4 typically provides data to the external device during the transmit mode.

Many older bi-directional buffers, in an effort to conserve power, discontinued DC current flow to a stage if it is not active (i.e., input stage not receiving or output stage not transmitting). However, turning DC current on and off takes time. As data rates became faster, the time required to turn a stage on and off could not be tolerated. Thus, in an attempt to meet the demand for higher data rates, DC current is not discontinued (i.e., input and output stages are not turned off and on). In order to concurrently conserve power and increase data rates, DC current is maintained during the receive and transmit modes, the variation in signal voltages is kept relatively small, and terminal impedances are matched to the coupled external device. However, because DC current is supplied to the buffer during an inactive period, power is wasted. Thus, it is desired to have a buffer that can turn current on and off quickly enough to meet current data rates.

SUMMARY OF THE INVENTION

An electronic circuit includes a current mirror and two stages. The current mirror provides a current, which is responsive to at least one low power signal. The first stage receives the current from the current mirror and directs the current to either a first voltage potential or to the second stage. The current is directed in response to at least one enable signal. If the current is directed to the second stage, the second stage receives the current and directs it to one of a plurality of output nodes. Directing of the current in the second stage is responsive to at least one control signal.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawing. Included in the drawing are the following figures.

DETAILED DESCRIPTION

Figure 2:
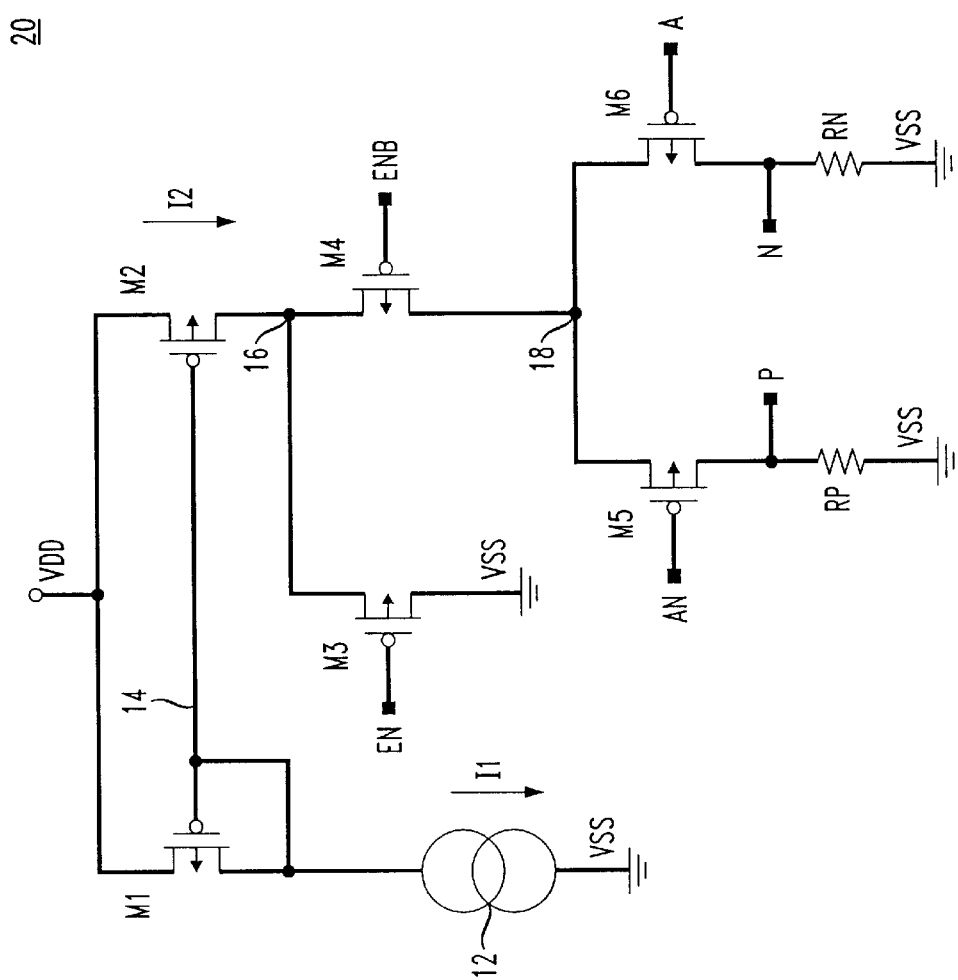
FIG. 2 (Prior Art) is a circuit diagram of a bi-directional buffer.

FIG. 2 is a circuit diagram of a prior art buffer, generally designated 20.

Figure 1:
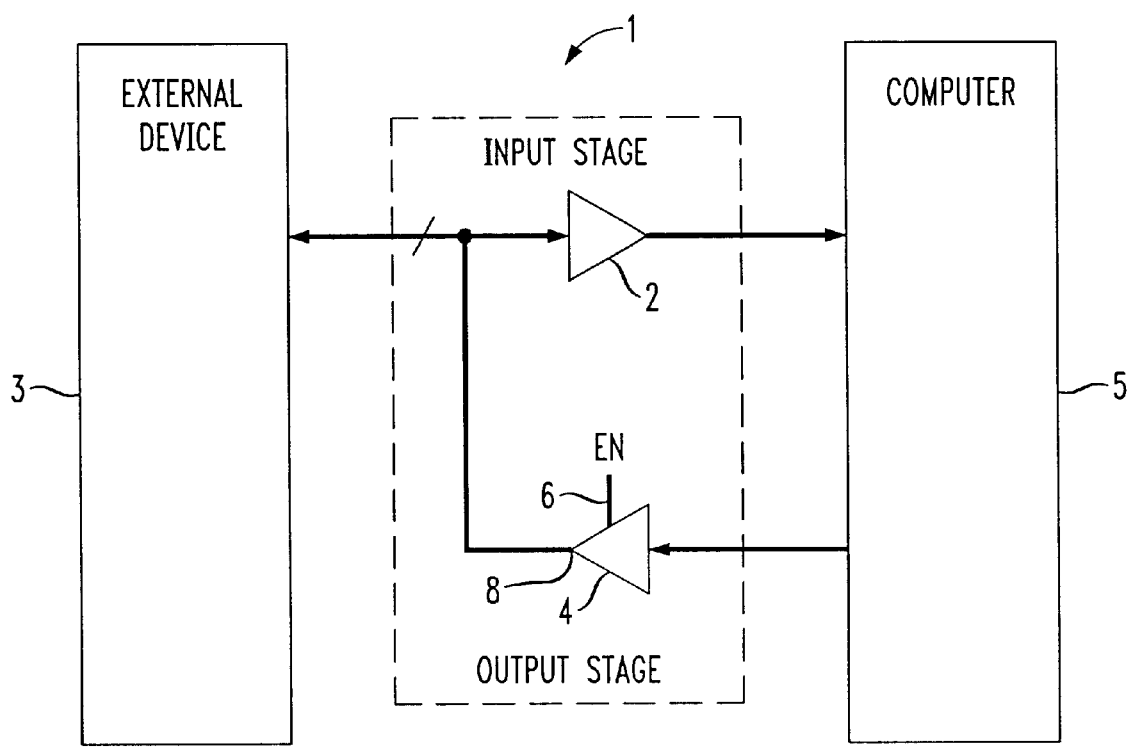
FIG. 1 (Prior Art) is a simplified block diagram of a typical bi-directional buffer.

Note that in circuit 20, nodes P and N, and corresponding resistors RP and RN are common to both the input stage and output stage of the bi-directional buffer. Thus, referring to FIG. 1, both external device 3 and computer 5 are coupled to nodes P and N. The voltages developed across RP and RN are the voltages received by computer 5 when the bi-directional buffer is in the receive mode, and are the voltages transmitted to the external device 3, when the bi-directional buffer is in the transmit mode. In circuit 20, current source 12 drives current I1 through transistor M1 to VSS (ground). Current I1 is mirrored by transistor M2. The current flowing through transistor M2 is I2. The ratio of I2 to I1 is equal to the ratio of the physical size of transistors M2 to M1. This size of each transistor is equal to the ratio of the width of the transistor to the length of the transistor (W/L).

Current I2 flows through node 16 and through either transistor M3 or M4, responsive to input enable signals EN and ENB. Input enable signals determine whether the buffer is in a receive mode or a transmit mode. During the receive mode, the buffer is capable of receiving data from an external device, and during the transmit mode, the buffer is capable of transmitting data to an external device. Input enable signals EN and ENB are complementary. That is, when EN is logic level high, ENB is logic level low (low), and when EN is low, ENB is high. Logic levels are also referred to by numbers, such that high is represented by the number 1 and low is represented by the number 0. Thus, another way to state the relationship between input enable signals EN and ENB is: EN=1 when ENB=0, and EN=0 when ENB=1. If EN=1, transistor M3 is turned off and transistor M4 is turned on. Current I2 flows through transistor M3 if EN=0 and flows through transistor M4 if ENB=0.

Thus, when EN=0, the buffer is in the receive mode, and when EN=1, the buffer is in the transmit mode.

When transistor M4 is turned on by ENB being low, current I2 flows through transistor M4 to node 18. Current I2 will flow through either transistor M5 or transistor M6, responsive to control signals A and AN. Control signals A and AN determine which external device will receive data from the buffer while in the transmit mode. Control signals A and AN are complementary. When control signal AN is low, current I2 flows through transistor M5 and through resistor RP. The voltage developed across resistor RP, which is also the voltage at node P with respect to ground, is I2×RP. Current I2 does not flow through M6 when control signal AN is low, because control signal A is high. Thus, transistor M6 is turned off and no current flows through resistor RN.

Because no current flows through resistor RN, no voltage is developed across resistor RN. Accordingly, node N is at ground potential and the voltage potential across nodes P and N is the same as the voltage developed across RP (i.e., I2×RP).

When control signal A is low, current I2 flows through transistor M6 and through resistor RN. The voltage developed across resistor RN, which is also the voltage at node N with respect to ground, is I2×RN. Current I2 does not flow through M5 when control signal A is low, because control signal AN is high. Thus, transistor M5 is turned off and no current flows through resistor RP. Because no current flows through resistor RP, no voltage is developed across resistor RP.

Accordingly, node P is at ground potential and the voltage potential across nodes P and N is the same as the voltage developed across RN (i.e., I2×RN).

When input enable signal EN is low, transistor M3 is turned on and transistor M4 is turned off. Therefore, current I2 flows through transistor M3 and not through transistor M4. In this case, current I2 is steered to ground. Because current I2 does not flow through either resistor RP or RN, no voltage is developed across either resistor RP or RN. Accordingly, both nodes P and N are at ground potential. Furthermore, nodes P and N are at ground potential regardless of the state of control signals A and AN.

Resistors RP and RN are also coupled, at nodes P and N, to a buffer input stage for receiving data from an external device. The coupling of resistors RP and RN to a buffer input stage is not shown in FIG. 2. The resistance values of resistors RP and RN are implemented to match the impedances of external devices and systems coupled to the buffer. For example, resistors RP and RN may be matched to the impedance of a backplane, or may be matched to the impedance of a network coupled to the buffer by a cable.

When the buffer is in the receive mode, transistor M3 is turned on and transistor M4 is turned off. Thus, a signal from an external device coupled to the buffer can drive nodes P and N, which are connected to an input stage of the buffer (input stage not shown in FIG. 2). Because the current mirror comprising transistors M1 and M2 is active (i.e., current flows through both transistor M1 and transistor M2) during the receive mode, the buffer can be switched to the transmit mode (by making EN=1 and ENB=0) without the delay associated with waiting for transistors M1 and M2 to conduct current (power up the current mirror).

A disadvantage of circuit 20, however, is that power is wasted due to the current flowing through transistors M1 and M2 during the receive mode. For example, typical values of resistance for resistors RP and RN range from approximately 25 ohms to 100 ohms. For an impedance of 25 ohms, and a desired signal swing of 500 mV, current I2 is 20 mA. A power supply, VDD, providing 3.3 volts results in the dissipation of 66 mW of power during the transmit mode. Assuming a ratio of transistor sizes for M2 to M1 to be approximately 20 to 1 (which is not unusual for current mirrors used in buffer circuits), I1=1 mA when I2=20 mA. Because the current mirror is active during the receive mode, 20 mA of current still flows through M2. Therefore, in this example, circuit 20 wastes approximately 66 mW of power while in the receive mode.

Figure 3:
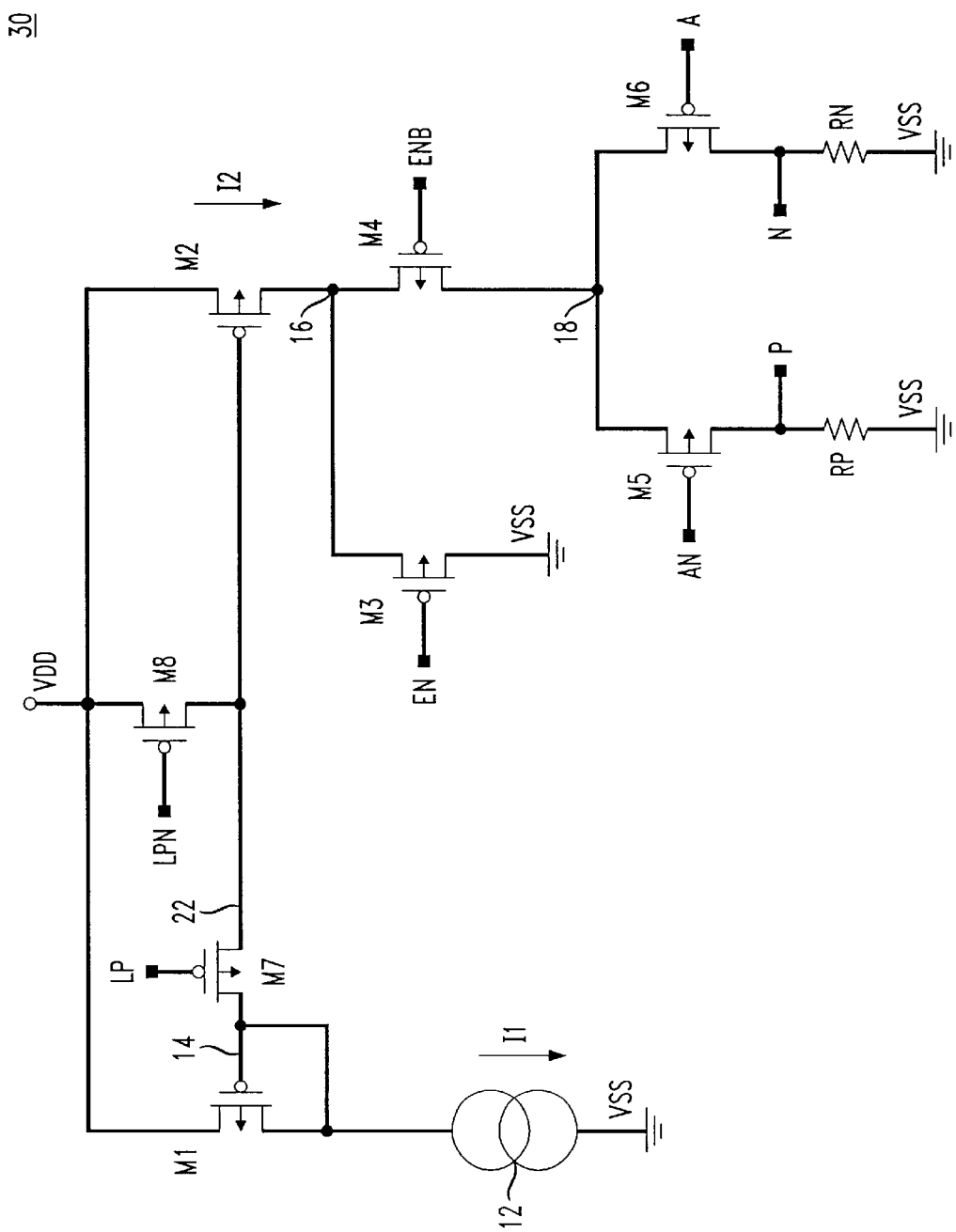
FIG. 3 is a circuit diagram of an exemplary bi-directional buffer in accordance with an embodiment of the invention.

FIG. 3 is a circuit diagram of an exemplary bi-directional buffer in accordance with an embodiment of the invention. The circuit in FIG. 3, generally designated 30, provides the capability to disable the current mirror comprising transistors M1 and M2 during the receive mode, and enable the current mirror comprising transistors M1 and M2 during the transmit mode. This capability is provided through the use of low power control signals, LP and LPN.

Low power control signals LP and LPN are complementary, thus when LP is low, LPN is high, and transistor M7 is turned on and transistor M8 is turned off. Accordingly, node 22 is coupled to node 14. In this configuration, the circuit 30 operates in the same manner as circuit 20. This configuration may be implemented during the transmit mode. Thus it is preferred to make LP=0, when transistor M4 is turned on (ENB=0). When LP=1 and LPN=0, circuit 30 is referred to as being in the low power mode. It is preferred to operate circuit 30 in the low power mode during the receive mode to conserve power. In the low power mode, transistor M7 is turned off and transistor M8 is turned on. The voltage potential at node 22, with respect to ground, is VDD (through transistor M8), which turns transistor M2 off. Thus, current I2 is discontinued and the only DC current flowing through circuit 30 is current I1 through transistor M1. When circuit 30 transitions from low power mode (LP=1) to active state (LP=0), the voltage potential with respect to ground at node 22 transitions from VDD to a P-channel threshold value ($V_{th-p}$) below VDD before transistor M2 will start conducting current. The smaller the value of current, I1, the longer it can take to start current conduction through transistor M2. For example, if I1=1 mA, I2=20 mA, and VDD=3.3 volts, it can take longer than 100 nano-seconds for current I2 to reach its nominal value. Thus, for circuits with an operating frequency over 100 MHz, it is advantageous to reduce the amount of time it takes for current I2 to reach its nominal value.

Figure 4:
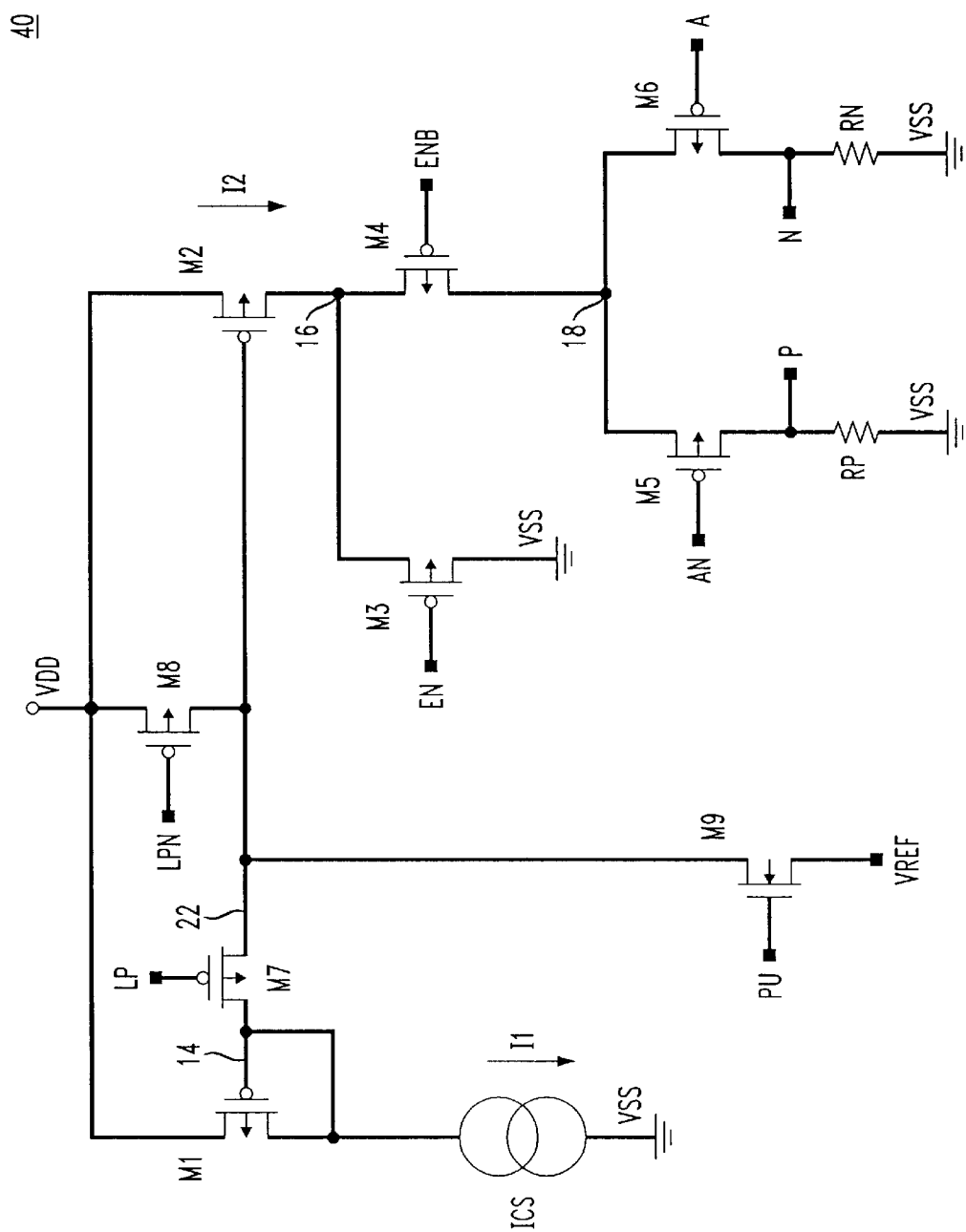
FIG. 4 is a circuit diagram of another exemplary embodiment of a bi-directional buffer in accordance with the invention.

FIG. 4 is a circuit diagram of another exemplary embodiment of a bi-directional buffer in accordance with the invention. The circuit in FIG. 4, generally designated 40, comprises a pull up circuit (also referred to as a kick start circuit) to decrease the amount of time it takes to turn transistor M2 on while transitioning out of the low power mode. The pull up circuit comprises transistor M9, which is coupled between node 22 and a reference voltage, VREF. Transistor M9 is an N-channel device. The gate of transistor M9 is coupled to a pull up control signal, PU. To decrease the amount of time it takes to turn transistor M2 on, the gate of transistor M9 is pulsed high by pull up control signal, PU, for approximately 1 to 2 nano-seconds when circuit 40 is transitioning from low power mode (LP=1) to active state (LP=0). Accordingly, the voltage potential with respect to ground at node 22 will be pulled from VDD to VREF, which turns transistor M2 on. In one embodiment of the invention, VREF approximately equal to VDD minus the P-channel threshold value of transistor M2 (i.e., VDD−$V_{th-p}$). The inventors have discovered that under these conditions, current I2 will reach it nominal value in approximately 3 to 4 nanoseconds.

In another exemplary embodiment of the invention, VREF is equal to ground (VSS). When VREF=VSS, the physical size of M9 and the pulse width of pull up control signal, PU, are designed to force the voltage potential of node 22 with respect to ground to VDD−$V_{th-p}$ within the desired time. Given VDD, $V_{th-p}$, VSS, and the desired time to turn transistor M2 on, the physical size of M9 and the pulse width of pull up control signal, PU, are easily calculated by those knowledgeable in the art.

Figure 5:
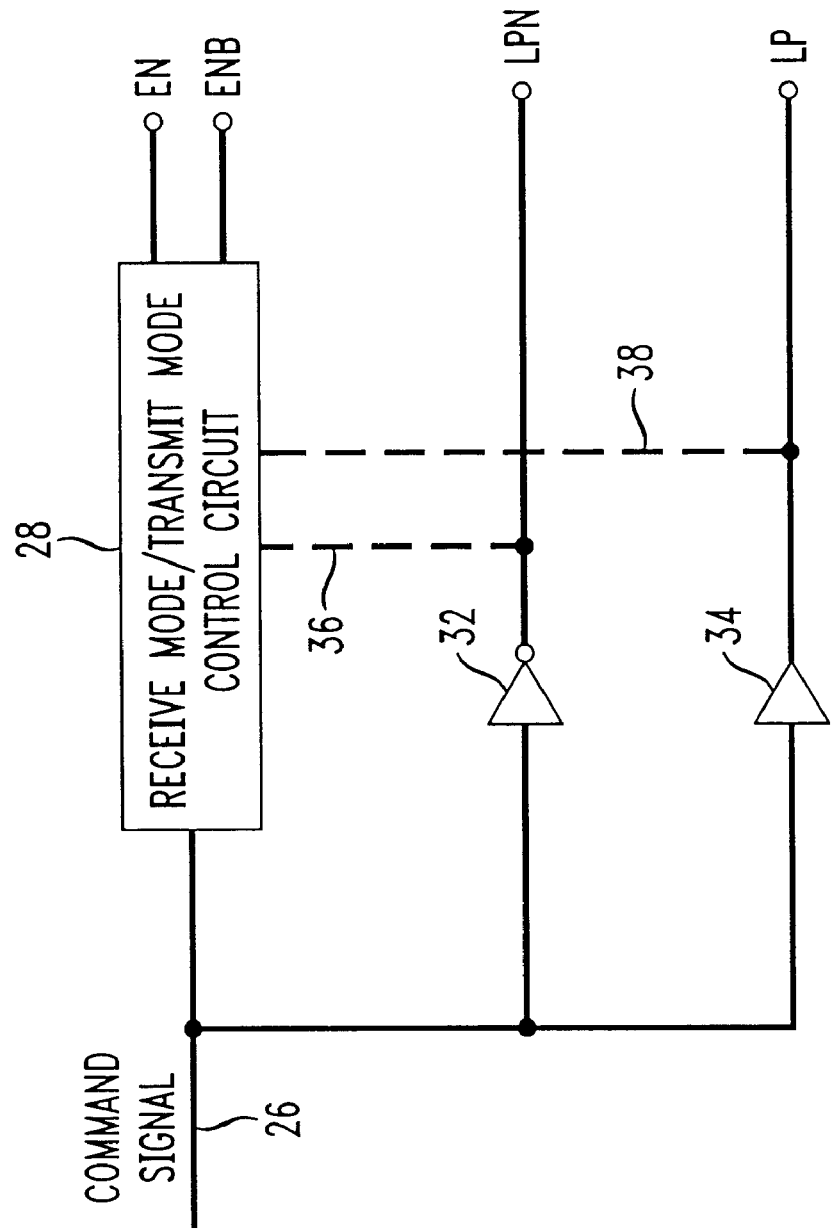
FIG. 5 is a functional block diagram of a source of low power signals in accordance with an exemplary embodiment of the invention.

In yet another embodiment of the invention, as shown in FIG. 5, terminals for low power control signals LP and LPN are coupled to a command signal line 26.

Command signal line 26 provides a command signal to a control circuit 28 that determines whether the bi-directional buffer is to be in transmit mode or in receive mode. Typically, receive mode/transmit mode control circuit 28 is a digital circuit having inherent latency embedded in the time starting from receipt of the command on command line 26 and ending with the time that a signal is received at the terminals for input enable signals EN and ENB. Thus, coupling the terminals for the low power control signals LP and LPN to command signal line 26 avoids the inherent latency in receive mode/transmit mode control circuit 28, and results in signals (early warning signals) being sensed at the LP and LPN terminals before signals are sensed at the EN and ENB terminals. These early warning signals may be applied to both circuits 30 and 40. Inverter 32 and buffer 34 are exemplary devices for ensuring that LP and LPN are complementary and that any time difference between LP and LPN are reduced (e.g., eliminate race conditions). Alternatively, LP and LPN terminals may be coupled to circuitry within the receive mode/transmit mode control circuit 28, providing the same functionality as command signal 26, as indicated by dashed lines 36 and 38.

It is emphasized that FIGS. 2 through 5 are exemplary. Although P-channel devices are shown, embodiments of the invention may incorporate N-channel devices. Further, although two termination resistors, RP and RN, and two output nodes, P and N, are shown, alternate embodiments of the invention comprise a plurality of output nodes and termination resistors.

The invention as described herein overcomes the disadvantages of the prior art by reducing the power consumption of a bi-directional buffer, while maintaining the ability of the bi-directional buffer to quickly switch between transmit and receive modes.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. An electronic circuit comprising:
   a current source for providing a current responsive to a pair of complementary low power signals, said complementary low power signals being in alternate binary states to provide a reduction in power consumption and an increase in switching speed;
   a first stage for receiving said current and directing said current, responsive to at least one enable signal, to one of a first voltage potential and a second stage;
   said second stage for receiving said current and directing said current to one of a plurality of output nodes, in response to at least one control signal;
   a control circuit for receiving a command signal and providing said at least one enable signal responsive to said command signal, said control circuit comprising an inherent latency, wherein:
      said pair of complementary low power signals are responsive to said command signal through a circuit such that changes in said command signal are sensed by said pair of complementary low power signals before being sensed by said at least one enable signal.

2. An electronic circuit in accordance with claim 1, wherein said current source is a current mirror.

3. An electronic circuit in accordance with claim 1, wherein said electronic circuit is an integrated circuit.

4. An electronic circuit in accordance with claim 1, wherein said current source comprises:
   a first transistor having a gate and two current carrying electrodes, wherein one of the current carrying electrodes of the first transistor is electrically coupled to the gate of the first transistor and to a source of current, and the other current carrying electrode of the first transistor is electrically coupled to a second voltage potential;
   a second transistor having a gate and two current carrying electrodes, wherein one of said two carrying electrodes of the second transistor is electrically coupled to said second voltage potential, and the other current carrying electrode of the second transistor is electrically coupled to said first stage;
   a third transistor having a gate and two current carrying electrodes, wherein one of the two current carrying electrodes of the third transistor is electrically coupled to said second voltage potential, the other one of the two current carrying electrodes of the third transistor is electrically coupled to the gate of the second transistor, and the gate of the third transistor is electrically coupled to one of said pair of complementary low power signals; and
   a fourth transistor, having a gate and two current carrying electrodes, wherein one of the two current carrying electrodes of the fourth transistor is electrically coupled to the gate of the first transistor, the other one of the two current carrying electrodes of the fourth transistor is electrically coupled to the gate of the second transistor, and the gate of the fourth transistor is electrically coupled to another one of said at least one low power signal.

5. An electronic circuit in accordance with claim 1, wherein said first stage comprises:
   a first transistor of the first stage having a gate and two current carrying electrodes, wherein one of the two current carrying electrodes of the first transistor of the first stage is electrically coupled to said first voltage potential, the second one of the two current carrying electrodes of the first transistor of the first stage is electrically coupled to said current source, and said gate of said first transistor of the first stage is electrically coupled to one of said at least one enable signal; and
   a second transistor of the first stage having a gate and two current carrying electrodes, wherein one of the two current carrying electrodes of the second transistor of the first stage is electrically coupled to said current source, the other one of the two current carrying electrodes of the second transistor of the first stage is electrically coupled to said second stage, and said gate of the second transistor of the first stage is electrically coupled to another one of said at least one enable signal.

6. An electronic circuit in accordance with claim 1, wherein said second stage comprises:
   a plurality of transistors each having a gate and two current carrying electrodes, wherein one of the two current carrying electrodes of each one of said plurality of transistors of the second stage is electrically coupled to said first stage, the other one of the two current carrying electrodes of each one of said plurality of transistors of the second stage is electrically coupled to a different one of said plurality of output nodes, and the gate of each of the plurality of transistors of the second stage is electrically coupled to a different one of the at least one control signal;
   a plurality of resistors, wherein each one of the plurality of resistors is electrically coupled between a different one of said plurality of output nodes and said first voltage potential.

7. An electronic circuit comprising:
a current source for providing a current responsive to at least one low power signal;
a first stage for receiving said current and directing said current, responsive to at least one enable signal, to one of a first voltage potential and a second stage;
said second stage for receiving said current and directing said current to one of a plurality of output nodes, in response to at least one control signal; and
a pull up circuit for reducing an amount of time in which said current source starts providing said current, wherein said pull up circuit is responsive to a pull up signal.

8. An electronic circuit in accordance with claim 7, wherein said pull up circuit is responsive to a pulse width of said pull up signal.

9. An electronic circuit in accordance with claim 7, wherein said pull up circuit comprises a pull up transistor having a gate and two current carrying electrodes, said two current carrying electrodes of said pull up transistor being electrically coupled between said current source and a reference voltage, said gate of said pull up transistor being electrically coupled to said pull up signal.

10. An electronic circuit in accordance with claim 9, wherein said current source comprises a current source transistor having a gate, and said current carrying electrodes of said pull up transistor are electrically coupled between the current source transistor gate and said reference voltage.

11. An electronic circuit in accordance with claim 10, said current source provides said current when a voltage on said current source transistor gate is one of greater than a threshold voltage and less than said threshold voltage, and said reference voltage is approximately equal to the difference between said first voltage potential and said threshold voltage.

12. An integrated bi-directional buffer circuit comprising:
a first transistor having a gate and two current carrying electrodes, wherein one of the two current carrying electrodes of the first transistor is electrically coupled to the gate of the first transistor and to a current source, and the other one of two current carrying electrode of the first transistor is electrically coupled to a first voltage potential;
a second transistor having a gate, a first current carrying electrode, and a second current carrying electrode, wherein the first current carrying electrode of the second transistor is electrically coupled to said first voltage potential;
a third transistor having a gate and two current carrying electrodes, wherein the two current carrying electrodes of the third transistor are electrically coupled between said first voltage potential and the gate of the second transistor, and the gate of the third transistor is electrically coupled to an inverted low power signal;

a fourth transistor, having a gate and two current carrying electrodes, wherein the two current carrying electrodes of the fourth transistor are electrically coupled between the gate of the first transistor and the gate of the second transistor, and the gate of the fourth transistor is electrically coupled to a low power signal;

a fifth transistor having a gate and two current carrying electrodes, wherein the two current carrying electrodes of the fifth transistor are electrically coupled between a second voltage potential and said second current carrying electrode of said second transistor, and said gate of said fifth transistor is electrically coupled to an enable signal;

a sixth transistor having a gate, a first current carrying electrode, and a second current carrying electrode, wherein the first current carrying electrode of the sixth transistor is electrically coupled to said second current carrying electrode of said second transistor, and said gate of the sixth transistor is electrically coupled to an inverted enable signal;

a seventh transistor having a gate and two current carrying electrodes, wherein the two current carrying electrodes of said seventh transistor are electrically coupled between said second current carrying electrode of said sixth transistor and a first output node, and the gate of the seventh transistor is electrically coupled to a first control signal;

an eighth transistor having a gate and two current carrying electrodes, wherein the two current carrying electrodes of said eighth transistor are electrically coupled between said second current carrying electrode of said sixth transistor and a second output node, and the gate of the eighth transistor is electrically coupled to a second control signal;

a first resistor and a second resistor, wherein the first resistor is electrically coupled between said first output node and said second voltage potential, and said second resistor is electrically coupled between said second output node and said second voltage potential; and a ninth transistor having a gate and two current carrying electrodes, wherein the current carrying electrodes of the ninth transistor are electrically coupled between a reference voltage and said gate of said second transistor, and said gate of said ninth transistor is electrically coupled to a pull up signal.

* * * * *